United States Patent
Izumitani

(10) Patent No.: US 6,476,496 B1
(45) Date of Patent: Nov. 5, 2002

(54) SEMICONDUCTOR DEVICE AND METHOD OF MANUFACTURING THE SAME

(75) Inventor: Junko Izumitani, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/461,377

(22) Filed: Dec. 15, 1999

(30) Foreign Application Priority Data

Jun. 28, 1999 (JP) ............................................. 11-181469

(51) Int. Cl.⁷ ................................................. H01L 29/94
(52) U.S. Cl. ........................................................ 257/774
(58) Field of Search ........................................ 257/774

(56) References Cited

U.S. PATENT DOCUMENTS 6,051,880 A * 4/2000 Kikuta
6,100,592 A * 8/2000 Pan
6,235,626 B1 * 5/2001 Makino et al.
6,300,683 B1 * 10/2001 Nagasaka et al.

FOREIGN PATENT DOCUMENTS

| JP | 57089243 | 6/1982 |
|----|----------|--------|
| JP | 2-34928  | 2/1990 |
| JP | 2-122628 | 5/1990 |
| JP | 03044032 | 2/1991 |
| JP | 5-299418 | 11/1993 |
| JP | 9-172017 | 6/1997 |
| TW | 358227   | 5/1999 |

* cited by examiner

*Primary Examiner*—Stephen D. Meier
(74) *Attorney, Agent, or Firm*—McDermott, Will & Emery

(57) ABSTRACT

An interconnection forming step provides an interconnection with an improved yield, a low cost and a high reliability. A semiconductor device includes an insulating layer formed on a silicon substrate and having a groove extending in a predetermined direction. A distance between side walls defining insulating layer increases as a position moves away from silicon substrate. The semiconductor device includes a conductive layer filling groove.

7 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and particularly a semiconductor device having a conductive layer and a method of manufacturing the same.

2. Description of the Background Art

Conventional semiconductor devices are provided with conductive layers, which are formed on semiconductor substrates and serve as interconnection layers, respectively. These conductive layers can be classified into a buried type and an unburied type. In the buried type, the conductive layer is located within a groove formed in an insulating layer, and thus is buried in the insulating layer. In the unburied type, the conductive layer is formed on the surface of the insulating layer and is not buried therein.

Usually, the conductive layer buried in the insulating layer is prepared in such a manner that the groove is formed in the insulating layer, and the conductive layer is formed to fill this groove. The unburied conductive layer is formed on the insulating layer, and the conductive layer thus formed is covered with another insulating layer.

Description will now be given on a problem caused by the conventional conductive layer described above.

First, in the structure which includes the conductive layer formed within the groove at the insulating layer, the groove is usually formed by anisotropic etching effected on the insulating layer. Therefore, the side wall of the groove is substantially perpendicular to the semiconductor substrate.

In the operation of filling the groove with a conductive material, therefore, the groove cannot be completely filled with the conductive material if the groove has a large aspect ratio. This results in a so-called "void" which is a hollow portion within the conductive layer not filled with the conductive material. The presence of the void causes an open failure in interconnections, and deteriorates the reliability.

The unburied conductive layer formed on the surface of the insulating layer is formed by anisotropic etching effected on the conductive material. Therefore, the side wall of the conductive layer is substantially perpendicular to the semiconductor substrate. In the structure which includes an insulating layer covering the conductive layer thus formed, a void or hollow portion may occur in the insulating layer.

Particularly, in a structure provided with a plurality of conductive layers formed in a narrow region, the voids are likely to occur in the insulating layer filling spaces between these conductive layers, and therefore an insulation failure is likely to occur in the insulating layer.

SUMMARY OF THE INVENTION

Accordingly, an object of the invention is to provide a semiconductor device having an interconnection and overcoming the above disadvantages, and particularly a semiconductor device which allows reliable filling of a groove with a conductive material, and can improve yields in an interconnection forming step as well as a cost and a reliability.

Another object of the invention is to provide a semiconductor device, in which a conductive layer can be reliably covered with an insulating layer, and an insulation failure can be prevented.

According to an aspect of the invention, a semiconductor device includes an insulating layer and a conductive layer. The insulating layer is formed on a semiconductor substrate. The insulating layer has a concavity extending in a predetermined direction. A distance between side walls defining the concavity increases as a position moves away from the semiconductor substrate. The conductive layer fills the concavity.

In the semiconductor device having the above structure, since the distance between the side walls defining the concavity increases as the position moves away from the semiconductor substrate, the concavity can be filled with the conductive layer more easily than the case where the distance between the side walls of the concavity is constant. Accordingly, occurrence of a void (hollow portion) in the conductive layer can be prevented, and increase in electric resistance of the conductive layer can be suppressed.

Further, the width of the conductive layer filling the concavity increases as the position moves away from the semiconductor substrate. Therefore, the sectional area can be larger than that of a conductive layer having a constant width so that an electric resistance of the conductive layer can be low.

Preferably, the side wall defining the concavity has a curved surface having a center of curvature located inside the side wall. In this structure, a distance between the side walls gradually increases as the position moves away from the semiconductor substrate, and the side wall inclines gently. Thereby, the concavity defined by the side walls can be filled more easily with the conductive layer, and occurrence of the void in the conductive layer can be prevented further effectively. As a result, increase in electric resistance of the conductive layer can be prevented further effectively.

More preferably, the conductive layer and the insulating layer have top surfaces, respectively. The top surface of the insulating layer is substantially flush with the top surface of the conductive layer. In this case, a level difference is not present between the top surfaces of the insulating layer and the conductive layer, and the flatness of the semiconductor device can be improved.

Further preferably, the conductive layer is made of a single conductive material or a plurality of conductive materials.

Preferably, a bottom wall of the concavity is formed of the surface of the semiconductor substrate. In this structure, the conductive layer filling the concavity can be electrically connected to the semiconductor substrate.

More preferably, the bottom wall of the concavity is formed of a surface of a conductive region on the semiconductor substrate. In this structure, the conductive layer filling the concavity can be electrically connected to the conductive region on the semiconductor substrate.

More preferably, the concavity is formed by effecting anisotropic etching on the insulating layer.

According to another aspect of the invention, a semiconductor device includes a conductive layer and an insulating layer. The conductive layer is formed on a semiconductor substrate. The conductive layer extends in a predetermined direction. The insulating layer covers the conductive layer. A distance between side walls defining the conductive layer decreases as a position moves away from the semiconductor substrate.

In the semiconductor device having the above structure, the distance between the side walls defining the conductive layer decreases as the position moves away from the semiconductor substrate. Thereby, the insulating layer can easily cover the conductive layer. Accordingly, no void occurs in the insulating layer, and an insulation failure can be suppressed.

More preferably, the side wall defining the conductive layer has a curved surface having a center of curvature located inside the side wall. In this structure, a distance between the side walls defining the conductive layer gradually decreases as the position moves away from the semiconductor substrate, and the side wall of the conductive layer inclines gently. Thereby, the insulating layer can cover the conductive layer more easily, and occurrence of the void can be prevented further effectively. As a result, occurrence of an insulation failure can be prevented further effectively.

More preferably, the conductive layer and the insulating layer have top surfaces, respectively. The top surface of the insulating layer is substantially flush with the top surface of the conductive layer. In this case, a level difference is not present between the top surfaces of the insulating layer and the conductive layer, and the flatness of the semiconductor device can be improved.

Further preferably, the conductive layer is made of a single conductive material or a plurality of conductive materials.

A method of manufacturing a semiconductor device according to an aspect of the invention includes the steps of forming an insulating layer on a semiconductor substrate; forming a concavity extending in a predetermined direction at a surface of the insulating layer; and effecting isotropic etching on the surface of the insulating layer to process the concavity such that a side wall defining the concavity has a curved surface. The step of processing the concavity is performed to process the concavity such that a center of curvature of the curved surface is located inside the side wall. The method of manufacturing the semiconductor device further includes the step of forming a conductive layer filling the processed concavity.

According to the method of manufacturing the semiconductor device including the above steps, the curved surface is formed in the concavity by effecting isotropic etching on the surface of the insulating layer. Thereby, a distance between side walls of the concavity gradually increases as a position moves away from the semiconductor substrate. Therefore, the concavity can be easily filled with the conductive layer, and occurrence of a void in the conductive layer can be prevented. Consequently, increase in electric resistance of the conductive layer can be suppressed.

The width of the conductive layer increases as the position moves away from the semiconductor substrate, similarly to the width of the concavity. Therefore, the conductive layer can have a large sectional area. Consequently, the electric resistance of the conductive layer can be reduced.

Preferably, the step of forming the conductive layer includes the steps of depositing a conductive material filling the processed concavity and covering the insulating layer, and forming the conductive layer by removing the conductive material until the surface of the insulating layer is exposed. More preferably, the step of forming the concavity includes execution of anisotropic etching on the insulating layer.

According to another aspect of the invention, a method of manufacturing a semiconductor device includes the steps of forming a conductive layer extending in a predetermined direction on a semiconductor substrate; and processing the conductive layer to provide a side wall defining the conductive layer and having a curve surface by effecting isotropic etching on the conductive layer. The step of processing the conductive layer is performed to process the conductive layer such that a center of curvature of the curved surface is located inside the side wall. The method of manufacturing the semiconductor device further includes the step of forming an insulating layer covering the processed conductive layer.

According to the method of manufacturing the semiconductor device including the above steps, the curved surface is formed in the side wall defining the conductive layer by effecting the isotropic etching on the conductive layer. Owing to this curved surface, a distance between the side walls of the conductive layer gradually decreases as the position moves away from the semiconductor substrate. Therefore, the conductive layer can be covered more easily with the insulating layer. As a result, no void occurs in the insulating layer, and occurrence of an insulation failure of the semiconductor device can be prevented. Preferably, the step of forming the conductive layer includes execution of anisotropic etching on the conductive material.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

First Embodiment

Figure 1:
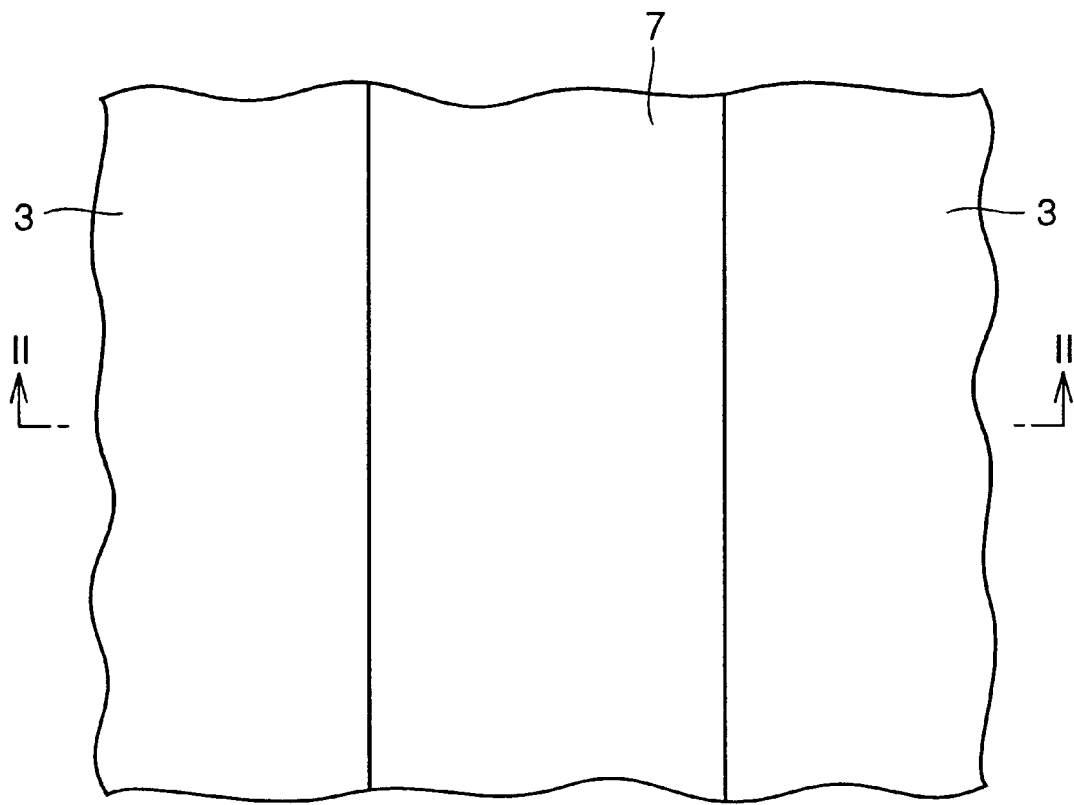
FIG. 1 is a plan showing a semiconductor device according to a first embodiment of the invention.
Figure 2:
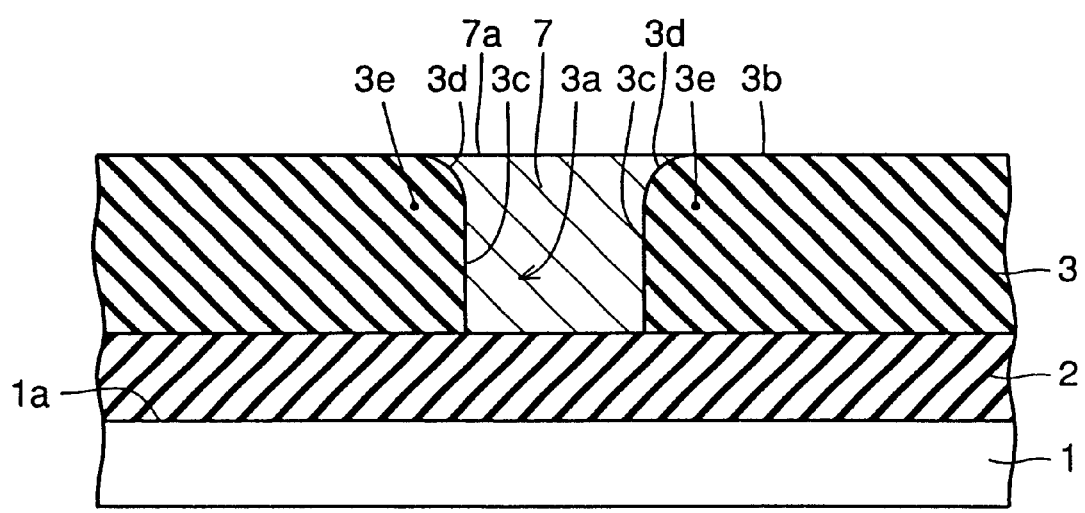
FIG. 2 shows a section taken along line II—II in FIG. 1.

Referring to FIGS. 1 and 2 showing a semiconductor device according to a first embodiment of the invention, a silicon substrate 1 is provided at its main surface 1a with an insulating layer 2. Another insulating layer 3 is formed on insulating layer 2.

Insulating layer 3 is provided with a groove 3a, which is a concavity extending in one direction. The groove 3a is defined by side walls 3c. A distance between side walls 3c gradually increases as a position moves away from silicon substrate 1. In particular, the distance between side walls 3c rapidly increases as the position near a top surface 3b of insulating layer 3 moves toward top surface 3b. At a portion near top surface 3b, each side wall 3c is provided with a round portion 3d formed of a curved surface. A center 3e of curvature of this curved surface is located inside side wall 3c and within insulating layer 3.

An inclination of a tangential line on side wall 3a is substantially 90 degrees in a portion near silicon substrate 1, and changes toward 0 degrees as the position moves away from silicon substrate 1. A portion of side wall 3c near top surface 3b has a substantially arc-shaped section.

The structure is also provided with a conductive layer 7 as an interconnection layer, which fills groove 3a in insulating layer 3 and extends in one direction. Conductive layer 7 is made of a single material which is alloy of aluminum and copper. A top surface 7a of conductive layer 7 is substantially flush with top surface 3b of insulating layer 3, and therefore a height from main surface 1a of silicon substrate 1 to top surface 7a is substantially equal to a height from main surface 1a to top surface 3b.

Figure 3:
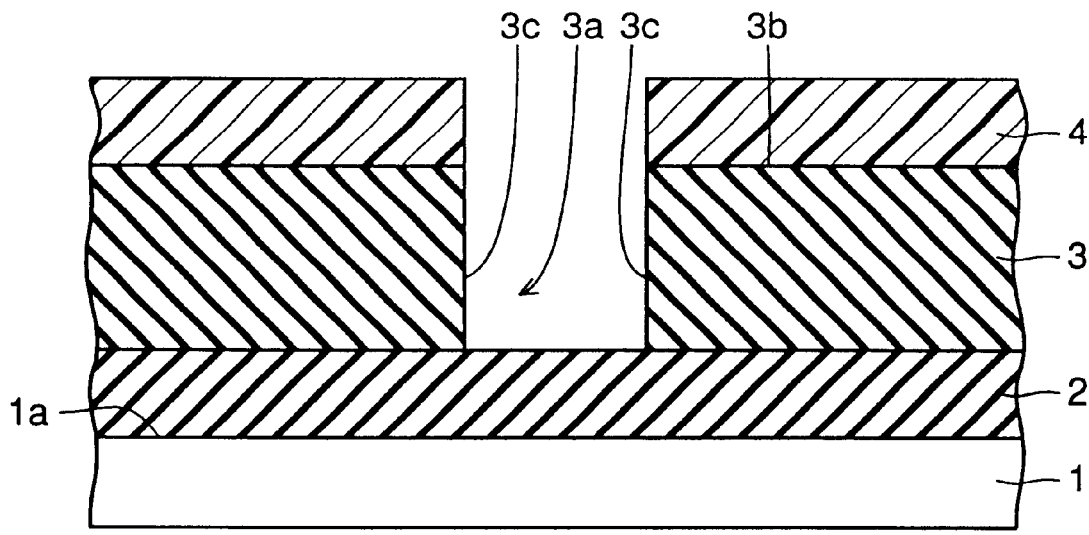
FIGS. 3 to 5 are cross sections showing first to third steps in a method of manufacturing the semiconductor device shown in FIG. 2.

Description will now be given on a method of manufacturing the semiconductor substrate described above. Referring to FIG. 3, an insulating layer 2 is formed on silicon substrate 1 by a CVD (Chemical Vapor Deposition) method. Insulating layer 3 made of a silicon oxide film is formed on insulating layer 2 by the CVD method. Resist is applied over insulating layer 3, and is patterned into a predetermined configuration through a photolithography step. Thereby, a resist pattern 4 is formed. Resist pattern 4 thus patterned is provided with a groove extending in one direction.

Anisotropic etching is effected on insulating layer 3 in accordance with resist pattern 4. Thereby, groove 3a is formed in insulating layer 3. Groove 3a is defined by side walls 3c. Side walls 3c are substantially perpendicular to main surface 1a of semiconductor substrate 1.

Figure 4:
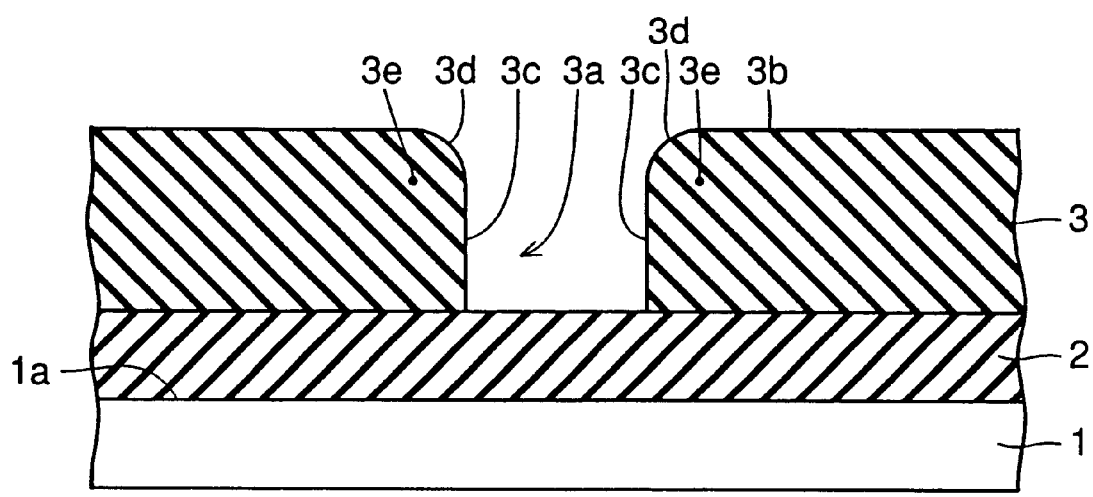

Referring to FIG. 4, insulating layer 3 is isotropically etched with hydrofluoric acid. Thereby, round portion 3d is formed in a portion of each side wall 3c near top surface 3b. Round portion 3d has an arc-shaped section, and a center of curvature thereof is located within insulating layer 3.

Figure 5:
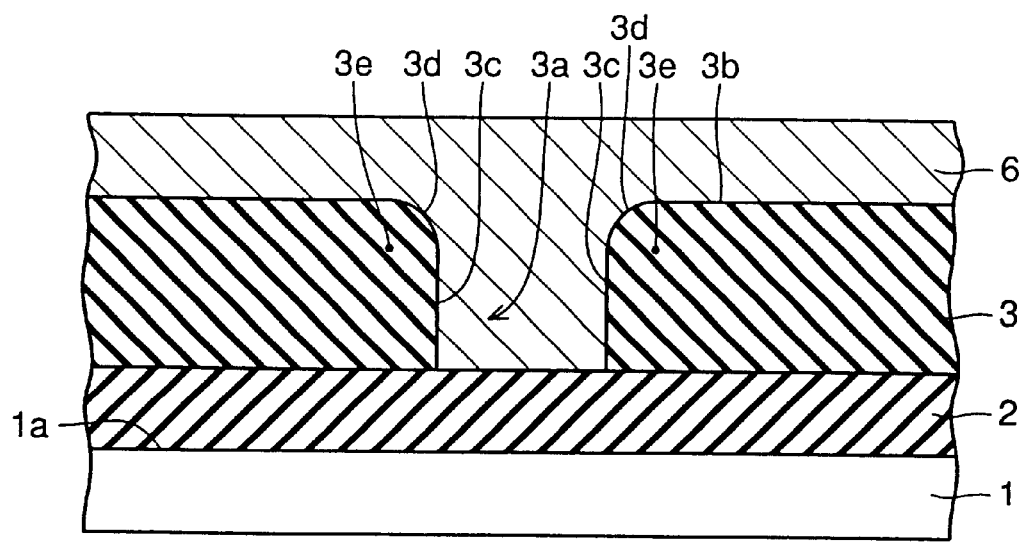

Referring to FIG. 5, a conductive material 6 made of alloy of aluminum and copper is formed by sputtering performed in an atmosphere at a temperature of about 400° C. As described above, conductive material 6 is formed of a so-called "hot aluminum" and, in other words, a film of alloy of aluminum and copper formed by the sputtering at a high temperature. Instead of this, a so-called "aluminum flow" may be employed and, more specifically, conductive material 6 may be formed by forming a film of alloy of aluminum and copper at a low temperature, and then keeping the film at a high temperature. Further, conductive material 6 may be made by copper, in which case conductive material 6 may be formed by CVD, plating or combination of the CVD and plating. Conductive material 6 may have two-layer structure formed of a main metal film and a barrier metal. In this case, the barrier metal may be formed by CVD, PVD or combination of CVD and PVD. In the case where alloy of aluminum and copper is employed as a material of the main metal film, this can be formed by the hot aluminum or the aluminum flow. In the case where the main metal film is made of copper, this can be formed by CVD, plating or combination of CVD and plating. Conductive material 6 fills groove 3a, and covers insulating layer 3.

Referring to FIG. 2, conductive material 6 is removed by a CMP (Chemical Mechanical Polishing) method to expose top surface 3b of insulating layer 3. Thereby, conductive layer 7 filling groove 3a is formed.

According to the above method of manufacturing the semiconductor device, round portion 3d is formed at each side wall 3 as shown in FIG. 4. Thereafter, conductive material 6 covering groove 3a is deposited. Therefore, conductive layer 6 can fill groove 3a more easily than the structure where round portion 3d is not employed. Accordingly, no void occurs in conductive material 6 within groove 3a, and therefore interconnection breakage as well as deterioration of reliability and lifetime can be prevented.

Further, a sectional area of conductive layer 7 increases as a position moves away from semiconductor substrate 1. Therefore, an electric resistance of conductive layer 7 can be low.

In the last step, top surface 7a of conductive layer 7 becomes flush with top surface 3b of insulating layer 3. Therefore, a new layer which will be formed on insulating layer 3 and conductive layer 7 can be flat.

Second Embodiment

Figure 6:
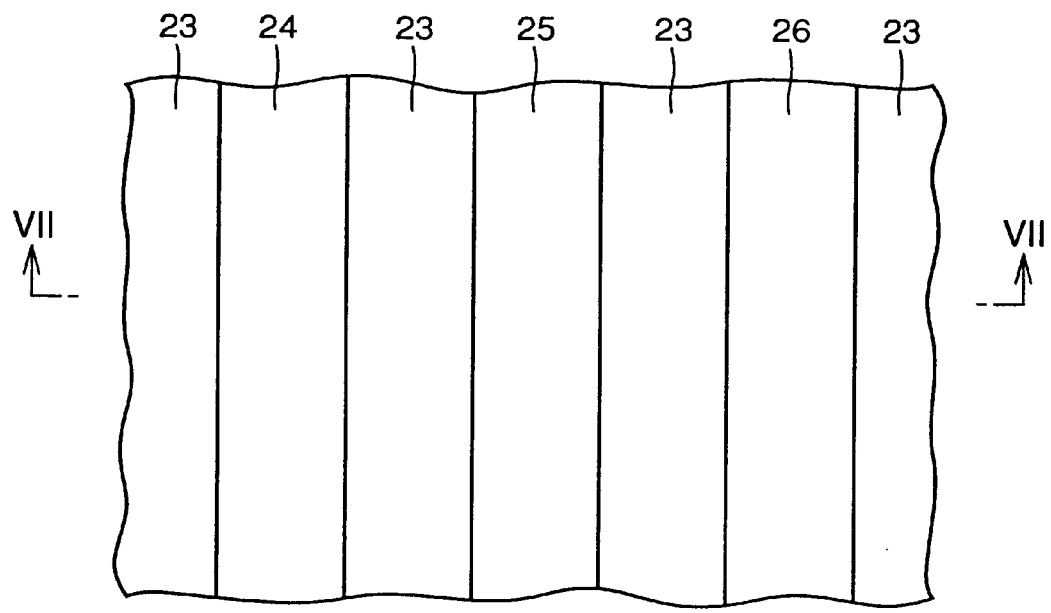
FIG. 6 is a plan showing a semiconductor device according to a second embodiment of the invention.
Figure 7:
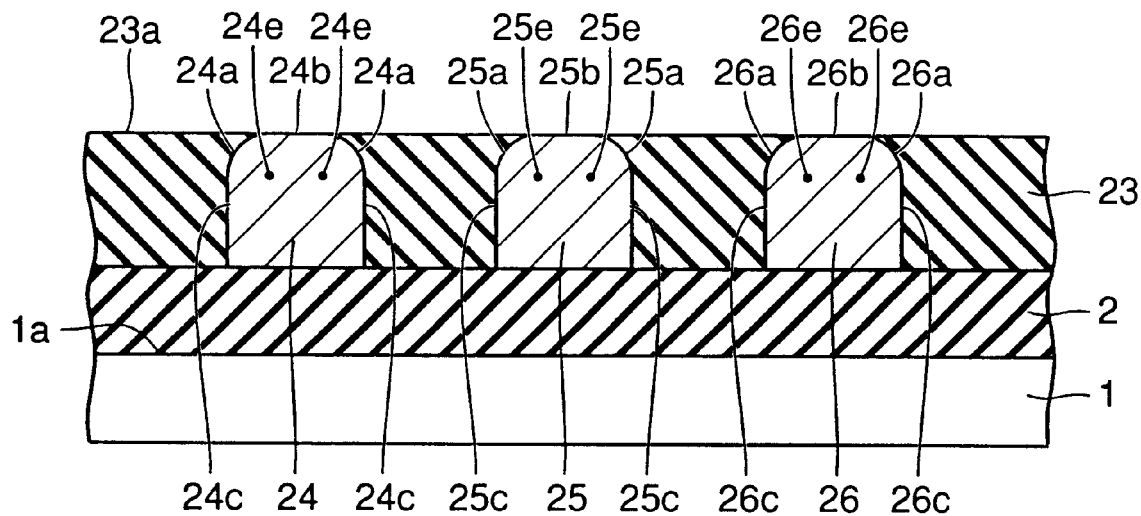
FIG. 7 shows a section taken along line VII—VII in FIG. 6.

Referring to FIGS. 6 and 7, a semiconductor device according to a second embodiment of the invention is provided with insulating layer 2 formed on main surface 1a of silicon substrate 1. Conductive layers 24, 25 and 26 extending in one direction are formed on insulating layer 2.

Each of conductive layers 24, 25 and 26 has side walls 24c, 25c or 26c. A distance between side walls 24c decreases as a position moves away from main surface 1a of silicon substrate 1. Likewise, a distance between sidewalls 25c and a distance between side walls 26c decrease as the position moves away from the main surface of silicon substrate 1.

Side walls 24c, 25c and 26c are provided at their upper portions with round portions 24a, 25a and 26a, respectively. Round portions 24a, 25a and 26a have substantially arc-shaped sections, respectively, and centers of curvature of round portions 24a, 25a and 26a are located inside corresponding side walls 24c, 25c and 26c and within corresponding conductive layers 24, 25 and 26, respectively.

Conductive layers 24, 25 and 26 have top surfaces 24b, 25b and 26b, respectively, which are substantially parallel with main surface 1a of silicon substrate 1. An inclination of tangential line on each of side walls 24c, 25c and 26c is close to 90 degrees in a portion near silicon substrate 1, gradually decreases as a position moves away from silicon substrate 1, and is substantially equal to 0 degrees in a portion near top surface 24b, 25b or 26b.

On insulating layer 2, there is formed an insulating layer 23 covering conductive layers 24, 25 and 26. A top surface 23a of insulating layer 23 is substantially flush with top surfaces 24b, 25b and 26b of conductive layers 24, 25 and 26. Therefore, distances from main surface 1a of silicon substrate 1 to top surfaces 24b, 25b and 26b are equal to a distance from main surface 1a of silicon substrate 1 to top surface 23a.

Figure 8:
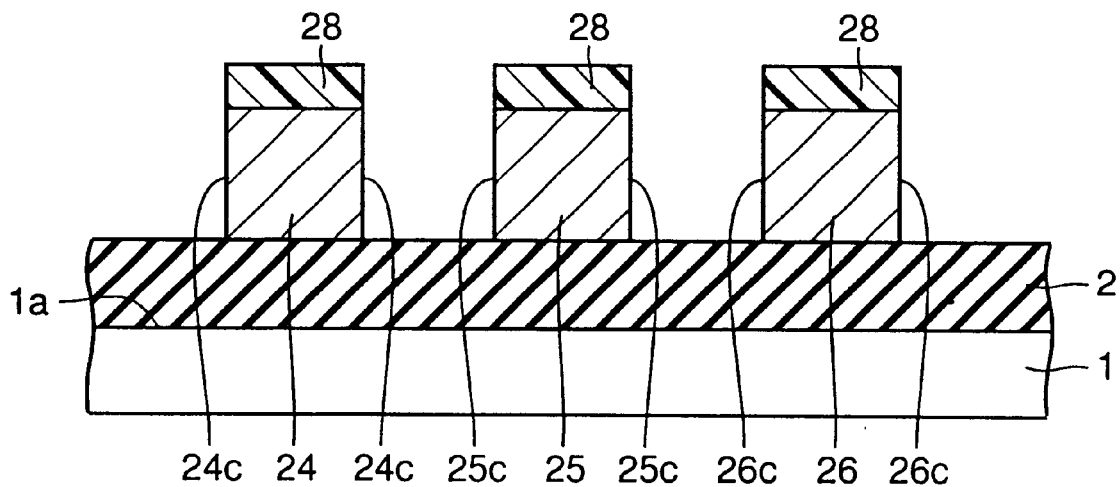
FIGS. 8 to 10 are cross sections showing first to third steps in a method of manufacturing the semiconductor device shown in FIG. 7.

Description will now be given on a method of manufacturing a semiconductor device shown in FIGS. 6 and 7. Referring to FIG. 8, insulating layer 2 is formed on main surface 1a of silicon substrate 1. On insulating layer 2, a single conductive material made of alloy of aluminum and copper is formed by sputtering. Resist is applied over the conductive material, and is patterned by a photolithography step into a predetermined configuration to form a resist pattern 28. The conductive material is anisotropically etched in accordance with resist pattern 28. Thereby, conductive layers 24, 25 and 26 extending in one direction are formed. Each of conductive layers 24, 25 and 26 has side walls 24c, 25c and 26c.

Figure 9:
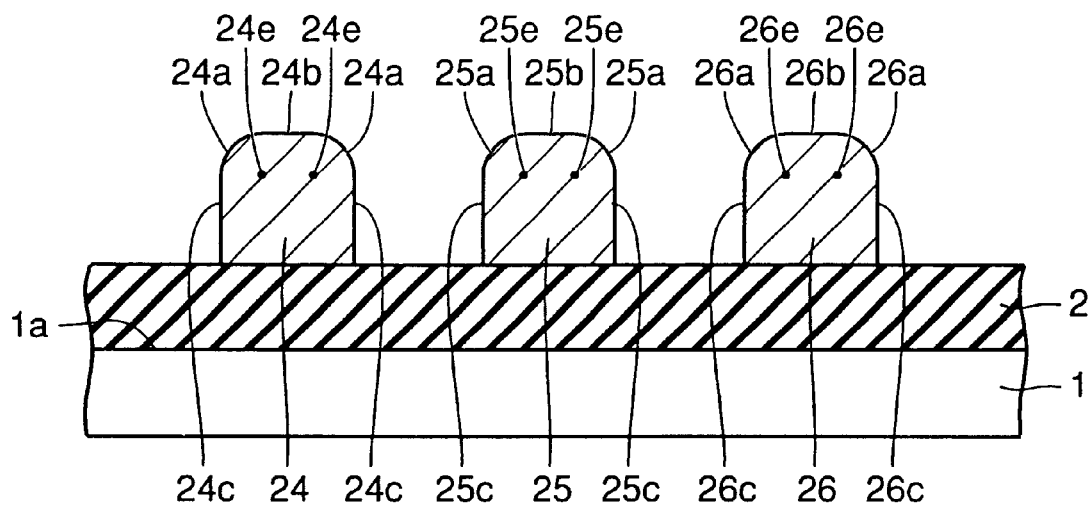

Referring to FIG. 9, etching is effected to form an interconnection configuration having a round section at its upper portion under conditions providing a low resist selection ratio. Thereby, round portions 24a, 25a and 26a are formed at upper portions of side walls 24c, 25c and 26c, respectively.

Figure 10:
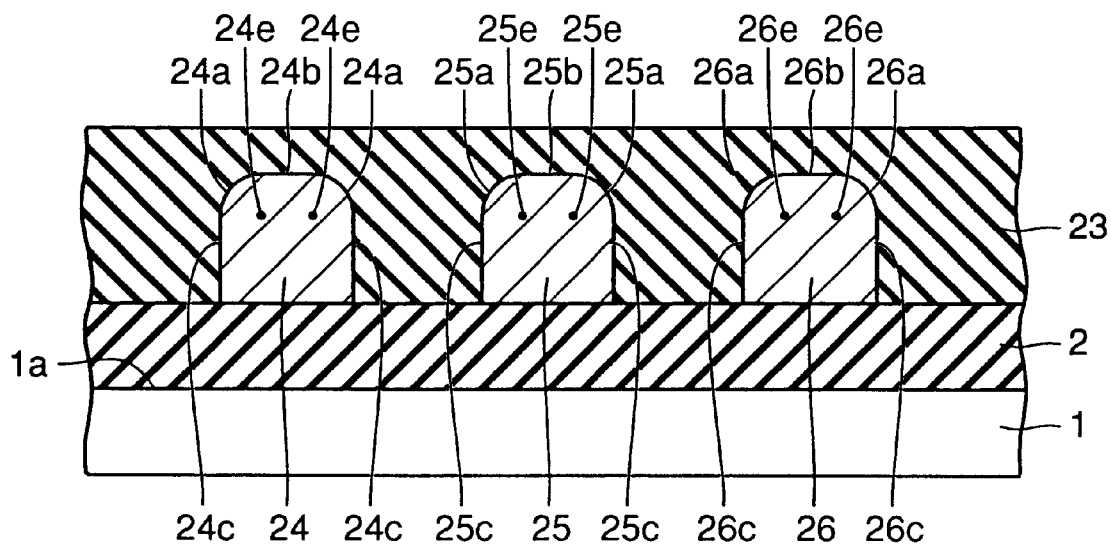

Referring to FIG. 10, a CVD method is conducted to form conductive layers 24, 25 and 26 covering insulating layer 23 formed of a silicon oxide film.

Referring to FIG. 7, insulating layer 23 is removed by the CMP method to expose top surfaces 24b, 25b and 26b of the conductive layers. Thereby, the semiconductor device shown in FIG. 7 is completed.

According to the method of manufacturing the semiconductor device described above, round portions 24a, 25a and 26a are formed at side walls 24c, 25c and 26c by the step shown in FIG. 9, respectively. Thereafter, insulating layer 23 covering conductive layers 24, 25 and 26 are formed. Therefore, the insulating layer can easily cover conductive layers 24, 25 and 26 without causing a void in insulating layer 23. Consequently, lowering in insulating performance of insulating layer 23 can be prevented.

In the step shown in FIG. 7, top surface 23a of insulating layer 23 becomes flush with top surfaces 24b, 25b and 26b of conductive layers 24, 25 and 26. Therefore, a new layer which will be formed on these top surfaces can be flat.

Although the embodiments of the invention have been described, various modifications can be employed.

In the first embodiment, the conductive layer is formed on insulating layer 2. Alternatively, the conductive layer may be formed in contact with silicon substrate 1. In this case, an impurity region may be formed at the surface of silicon substrate 1, and may be electrically connected to the conductive layer. A conductive layer may be formed in insulating layer 2, and may be connected to the conductive layer which is manufactured according to the invention.

Further, a contact hole may be formed, and may be isotropically etched to form a round portion similar to that of the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an insulating layer formed on a semiconductor substrate, and having a concavity extending in a predetermined direction,
   a distance between side walls defining said concavity increasing as a postion moves away from said semiconductor substrate; and
   a conductor layer made of a single conductive material filling said concavity.

2. The semiconductor device according to claim 1, wherein
   said side wall defining said concavity has a curved surface having a center of curvature located inside said side wall.

3. The semiconductor device according to claim 1, wherein
   said conductive layer and said insulating layer have top surfaces, respectively, and the top surface of said insulating layer is substantially flush with the top surface of said conductive layer.

4. The semiconductor device according to claim 1, wherein
   said conductive layer is made of a single conductive material or a plurality of conductive materials.

5. The semiconductor device according to claim 1, wherein
   a bottom wall of said concavity is formed of the surface of said semiconductor substrate.

6. The semiconductor device according to claim 1, wherein
   a bottom wall of said concavity is formed of a surface of a conductive region on said semiconductor substrate.

7. The semiconductor device according to claim 1, wherein
   said concavity is formed by effecting anisotropic etching on said insulating layer.

* * * * *